(12) United States Patent
Aigo et al.

(10) Patent No.: US 11,114,295 B2
(45) Date of Patent: Sep. 7, 2021

(54) EPITAXIAL SILICON CARBIDE SINGLE CRYSTAL WAFER AND PROCESS FOR PRODUCING THE SAME

(71) Applicant: SHOWA DENKO K.K., Tokyo (JP)

(72) Inventors: Takashi Aigo, Tokyo (JP); Wataru Ito, Tokyo (JP); Tatsuo Fujimoto, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/901,435

(22) Filed: Jun. 15, 2020

(65) Prior Publication Data

US 2020/0312656 A1 Oct. 1, 2020

Related U.S. Application Data

(62) Division of application No. 15/544,697, filed as application No. PCT/JP2016/054443 on Feb. 16, 2016, now Pat. No. 10,727,047.

(30) Foreign Application Priority Data

Feb. 18, 2015 (JP) .................................. 2015-029524

(51) Int. Cl.
*H01L 21/02* (2006.01)
*C30B 25/16* (2006.01)
(Continued)

(52) U.S. Cl.
CPC ...... *H01L 21/02378* (2013.01); *C23C 16/029* (2013.01); *C23C 16/325* (2013.01);
(Continued)

(58) Field of Classification Search
CPC ............. H01L 21/02378; H01L 21/205; H01L 21/02271; H01L 21/02293;
(Continued)

(56) References Cited

U.S. PATENT DOCUMENTS

2005/0181627 A1 8/2005 Kamata et al.
2010/0133550 A1* 6/2010 Zhang ................. H01L 29/1608
257/77
(Continued)

FOREIGN PATENT DOCUMENTS

JP 2000-164528 A 6/2000
JP 2008-74664 A 4/2008
(Continued)

OTHER PUBLICATIONS

Fujiwara et al., Advanced Power Semiconductor Subcommittee First Workshop text of the Applied Physics Society, The Japan Society of Applied Physics, vol. 1, No. 1, Jul. 30, 2014, pp. 31-35 (9 pages total), with Partial English translation.
(Continued)

*Primary Examiner* — Cuong B Nguyen
(74) *Attorney, Agent, or Firm* — Birch, Stewart, Kolasch & Birch, LLP

(57) ABSTRACT

An epitaxial silicon carbide single crystal wafer having a small depth of shallow pits and having a high quality silicon carbide single crystal thin film and a method for producing the same are provided. The epitaxial silicon carbide single crystal wafer according to the present invention is produced by forming a buffer layer made of a silicon carbide epitaxial film having a thickness of 1 μm or more and 10 μm or less by adjusting the ratio of the number of carbon to that of silicon (C/Si ratio) contained in a silicon-based and carbon-based material gas to 0.5 or more and 1.0 or less, and then by forming a drift layer made of a silicon carbide epitaxial film at a growth rate of 15 μm or more and 100 μm or less per hour. According to the present invention, the depth of the shallow pits observed on the surface of the drift layer can be set at 30 nm or less.

2 Claims, 3 Drawing Sheets

(51) Int. Cl.
  *C30B 29/36* (2006.01)
  *H01L 21/205* (2006.01)
  *C23C 16/32* (2006.01)
  *C30B 25/18* (2006.01)
  *C30B 25/20* (2006.01)
  *C23C 16/02* (2006.01)
  *C23C 16/455* (2006.01)
  *C30B 29/06* (2006.01)

(52) U.S. Cl.
  CPC ........ *C23C 16/45523* (2013.01); *C30B 25/16* (2013.01); *C30B 25/183* (2013.01); *C30B 25/186* (2013.01); *C30B 25/20* (2013.01); *C30B 29/06* (2013.01); *C30B 29/36* (2013.01); *H01L 21/0262* (2013.01); *H01L 21/02433* (2013.01); *H01L 21/02529* (2013.01); *H01L 21/02658* (2013.01); *H01L 21/205* (2013.01)

(58) Field of Classification Search
  CPC ........ H01L 21/02598; H01L 21/02433; H01L 21/02529; H01L 21/0262; H01L 21/02658; C23C 16/325; C23C 16/029; C23C 16/45523; C30B 25/183; C30B 25/20; C30B 25/186; C30B 29/06; C30B 25/16; C30B 29/36
  See application file for complete search history.

(56) References Cited

U.S. PATENT DOCUMENTS

| | | |
|---|---|---|
| 2011/0006309 A1 | 1/2011 | Momose et al. |
| 2012/0146056 A1 | 6/2012 | Momose et al. |
| 2012/0280254 A1 | 11/2012 | Muto et al. |
| 2014/0001490 A1 | 1/2014 | Konstantinov |
| 2014/0117381 A1 | 5/2014 | Kang et al. |
| 2014/0175461 A1 | 6/2014 | Momose et al. |
| 2015/0311290 A1 | 10/2015 | Kang et al. |
| 2016/0355949 A1* | 12/2016 | Wada .................. C23C 16/325 |

FOREIGN PATENT DOCUMENTS

| | | |
|---|---|---|
| JP | 2011-49496 A | 3/2011 |
| JP | 2011-121847 A | 6/2011 |
| JP | 2013-58709 A | 3/2013 |
| JP | 2013-239606 A | 11/2013 |
| JP | 2014-93526 A | 5/2014 |
| WO | WO 03/078702 A1 | 9/2003 |
| WO | WO 2009/035095 A1 | 3/2009 |
| WO | WO 2014/084549 A1 | 6/2014 |

OTHER PUBLICATIONS

International Search Report for PCT/JP2016/054443, dated Apr. 12, 2016.
U.S Advisory Action for U.S. Appl. No. 15/544,697, dated Feb. 4, 2019.
U.S. Notice of Allowance for U.S. Appl. No. 15/544,697, dated Mar. 25. 2020.
U.S. Office Action for U.S. Appl. No. 15/544,697, dated Dec. 18, 2019.
U.S. Office Action for U.S. Appl. No. 15/544,697, dated Jul. 5, 2019.
U.S. Office Action for U.S. Appl. No. 15/544,697, dated Jun. 4, 2018.
U.S. Office Action for U.S. Appl. No. 15/544,697, dated Oct. 19, 2018.
U.S. Restriction Requirement for U.S. Appl. No. 15/544,697, dated Mar. 16, 2018.

* cited by examiner

EPITAXIAL SILICON CARBIDE SINGLE CRYSTAL WAFER AND PROCESS FOR PRODUCING THE SAME

CROSS REFERENCE TO RELATED APPLICATIONS

This application is a Divisional of copending application Ser. No. 15/544,697, filed on Jul. 19, 2017, which is a national phase of PCT International Application No. PCT/JP2016/054443 filed on Feb. 16, 2016, which claims the benefit under 35 U.S.C. § 119(a) to Patent Application No. 2015-029524, filed in Japan on Feb. 18, 2015, all of which are hereby expressly incorporated by reference into the present application.

TECHNICAL FIELD

The present invention relates to a method for producing an epitaxial silicon carbide single crystal wafer, and an epitaxial silicon carbide single crystal wafer obtained by this method.

BACKGROUND ART

Since silicon carbide (hereinafter referred to as SiC) is superior in heat resistance and mechanical strength, and is physically and chemically stable, it is attracting attention as an environment resistant semiconductor material. In recent years, there is also an increasing demand for epitaxial SiC single crystal wafers as substrates for high-frequency, high-voltage electronic devices and the like.

When a power device, a high-frequency device or the like are fabricated using a SiC single crystal substrate (hereinafter referred to as a SiC substrate), a method called thermal CVD (thermal chemical vapor deposition) is generally used to effect the epitaxial growth of a SiC thin film or to inject a dopant directly by ion injection method. In the latter case, however, annealing at high temperature is required after injection, and therefore thin film formation by epitaxial growth is frequently used.

On the epitaxial film of SiC, epitaxial defects such as triangular defects, carrot defects, and comet defects may be present and devices having these defects have markedly deteriorated characteristics. Therefore, they are known as so-called "device killer defects". Thus, techniques for reducing epitaxial defects have been developed, one of which is a technique of fabricating an epitaxial film in a two-layer structure comprising a buffer layer and a drift layer. By this technique, in most cases, epitaxial defects are reduced in such a way that a drift layer is made to have a thickness or doping density required for device fabrication, and, in order to form a layer as a buffer layer, a layer having a doping density intermediate between the SiC substrate and the drift layer is grown, and thereby the difference between the doping densities of both is relaxed in order to reduce distortion, which leads to reduced epitaxial defects.

Patent Document 1 proposes to control the dopant concentration in a gradually decreasing manner during the growth process of the SiC epitaxial film in order to suppress the propagation of the basal plane dislocation from the SiC single crystal wafer to the SiC epitaxial film. Further, Patent Document 1 proposes to suppress conversion from the misfit dislocation to the threading edge dislocation by controlling the C/Si molar ratio in the source gas to about 0.3 to 3 and controlling the growth rate of the SiC epitaxial film to 5 µm/h or more. It is known that threading edge dislocation can become a lifetime killer of minor carriers, and since it deteriorates the device characteristics, according to the invention disclosed in Patent Document 1, the yield of the fabricated device can be improved.

Although such technologies have reduced device killer defects and dislocations that deteriorate device characteristics as described above, it has been found, in recent years, that minute pits (shallow pits) on the epitaxial film adversely affect the device characteristics (See Non-Patent Document 1). Non-patent document 1 has shown that shallow pits particularly increase the reverse leakage current of the Schottky barrier diode. The increase in the reverse leakage current is thought to be caused by the concentration of the electric field at the pit portion. Therefore, in order to improve the device characteristics and yield, it is necessary to reduce not only device killer defects but also these shallow pits.

Shallow pits have a substantially triangular shape and generally have a depth of about 50 to 80 nm, and are contained in the SiC epitaxial film at a density of 500 to 1000 pieces/cm$^2$. The shape and depth of shallow pits are believed to be related to, for example, the pretreatment of the SiC substrate performed before growth, the ratio of the number of carbon to silicon (C/Si ratio) contained in the material gas during growth, the growth rate, the growth temperature and the like. However, studies so far have also suggested the combined effects of them.

As described below, since shallow pits are formed by virtue of the screw dislocation of the SiC single crystal wafer, the shape and depth of the shallow pits also depend on the quality of the SiC substrate itself. Since the screw dislocation of the SiC single crystal wafer generally differs greatly from substrate to substrate, it is currently difficult to stably reduce shallow pits. In the case of the production method relating to the reduction of penetration edge dislocations disclosed in Patent Document 1, it is considered difficult to reduce the shallow pits associated with the screw dislocation of the SiC substrate.

Patent Document 2 discloses a method for reducing the device killer defects described above. According to this method, at least one inhibition layer having a surface roughness Ra value of 0.5 nm or more and 1.0 nm or less is epitaxially grown at a C/Si ratio of 1.0 or less, and then an active layer of a silicon carbide single crystal thin film is epitaxially grown on the above inhibition layer at a C/Si ratio of 1.0 or more. Patent Document 2 reports that by controlling the C/Si ratio to 1.0 or less at the initial stage of epitaxial growth, it becomes to be increasingly likely that the occurrence of spiral growth originating from screw dislocation is suppressed and the dislocation is covered with a large amount of surrounding step-flows. However, as described below, the inventors of the present invention have found that, since the thickness of the inhibition layer is 1 µm or less, it is difficult with such a level of thickness to sufficiently cover the spiral step around the shallow pits with steps in the step-flow direction.

In addition, Patent Document 3 discloses a silicon carbide semiconductor device, in which a Schottky junction was provided on the silicon carbide semiconductor by depositing a high melting point metal on the surface of a SiC epitaxial layer to form a layer which is made of alloy of the high melting point metal and the SiC epitaxial layer. However, Patent Document 3 does not disclose any reduction of device killer defects from the SiC epitaxial layer.

Accordingly, although the epitaxial SiC single crystal wafer is expected to be applied to devices in the future, it will be difficult to fabricate electronic devices having excellent characteristics with high yield unless an epitaxial film with reduced influence from shallow pits can grow without depending on the quality of the SiC substrate.

PRIOR ART DOCUMENTS

Patent Documents

Patent Document 1: Re-publication of PCT International Publication WO 2009/035095
Patent Document 2: Kokai (Japanese Unexamined Patent Publication) No. 2008-74664
Patent Document 3: Kokai (Japanese Unexamined Patent Publication) No. 2000-164528

Non-Patent Documents

Non-Patent Document 1: Fujiwara et al., Advanced Power Semiconductor Subcommittee First Workshop text p 31 (2014) of the Applied Physics Society

SUMMARY OF THE INVENTION

Problems to be Solved by the Invention

In view of the above, the present invention provides a method for producing an epitaxial SiC single crystal wafer having a high-quality epitaxial film in which the influence from shallow pits is reduced as compared with the conventional method during the SiC epitaxial growth with a SiC substrate.

Means to Solve the Problems

After detailed investigation on the expression of shallow pits in a SiC epitaxial film, the inventors of the present invention have found that shallow pits occur by virtue of the screw dislocation of the SiC substrate. However, since the screw dislocation density of the SiC substrate differs greatly from substrate to substrate, the inventors of the present invention thought that a reduction in the depth of shallow pits rather than the density of shallow pits would be more effective in reducing the influence from the shallow pits without depending on the quality of the substrate thus the inventors conducted further research.

As a result, though the construction of a SiC epitaxial film in a two-layered structure comprising a buffer layer and a drift layer is conventionally known, it was found by the inventors of the present invention that the optimization of the C/Si ratio during the growth of the buffer layer, the thickness of the buffer layer, and the growth rate during growth of the drift layer can lead to a reduction in the depth of shallow pits. In addition, the inventors have found that as the depth of shallow pits of the prototyped Schottky barrier diode is reduced more, the concentration of the electric field at the pit portion can be alleviated and thus the reverse leakage current equivalent to that of a diode having no pits can be obtained, and have therefore completed the present invention.

Thus, the gist of the present invention lies in:
(1) A method for producing an epitaxial silicon carbide single crystal wafer by allowing a silicon-based and carbon-based material gas to flow over a silicon carbide single crystal substrate having an off angle of 4° or less, which is an angle tilted in the <11-20> direction with respect to the (0001) plane, in order to epitaxially grow the silicon carbide by a thermal CVD method, the method comprising:

bringing the depth of the shallow pits observed on the surface of the drift layer to 30 nm or less by
forming a buffer layer consisting of a silicon carbide epitaxial film having a thickness of 1 μm or more and 10 μm or less by adjusting the ratio of the number of carbon atoms to that of silicon atoms (C/Si ratio) in the silicon-based and carbon-based material gas to 0.5 or more and 1.0 or less, and forming a drift layer consisting of a silicon carbide epitaxial film at a growth rate of 15 μm or more and 100 μm or less per hour;
(2) The method according to (1) for producing an epitaxial silicon carbide single crystal wafer comprising:
growing the buffer layer at a growth rate of 1 μm or more and 10 μm or less per hour; and
growing the drift layer at the atomic ratio (C/Si ratio) of 1.0 or more and 2.0 or less;
(3) An epitaxial silicon carbide single crystal wafer comprising:
a silicon carbide single crystal substrate having an off angle of 4° or less, which is an angle tilted in the <11-20> direction with respect to the (0001) plane;
a buffer layer, formed on the silicon carbide single crystal substrate, having a doping density of $1 \times 10^{18}$ atms/cm$^3$ or more and $1 \times 10^{19}$ atms/cm$^3$ or less and consisting of a silicon carbide epitaxial film having a thickness of 1 μm or more and 10 μm or less; and
a drift layer, formed on the buffer layer, having a doping density of $1 \times 10^{15}$ atms/cm$^3$ or more and $1 \times 10^{17}$ atms/cm$^3$ or less and consisting of a silicon carbide epitaxial film having a thickness of 10 μm or more and 30 μm or less,
wherein the depth of the shallow pits on the surface of the drift layer is 30 nm or less, and when a Schottky barrier diode is formed by providing a Ni-based ohmic electrode on the side of the silicon carbide single crystal substrate and a Ni-based Schottky electrode on the side of the drift layer, the leakage current at a reverse applied voltage of 400 V becomes $1 \times 10^{-11}$ A/cm$^2$ or more and $1 \times 10^{-8}$ A/cm$^2$ or less.

Effect of the Invention

According to the present invention which grows an epitaxial film on the SiC substrate having an off angle of about 4° or less, it is possible to stably obtain an epitaxial SiC single crystal wafer having a high-quality epitaxial film in which the influence from shallow pits is reduced as compared with the conventional film.

Furthermore, since a high-quality epitaxial film is obtained by a thermal CVD method according to the present invention, the method according to the present invention is a method that can be conducted using a simple apparatus configuration and has excellent controllability and a method that produces a highly uniform and reproducible epitaxial SiC single crystal wafer.

Furthermore, since a device that employs the epitaxial SiC single crystal wafer obtained by the present invention can be formed on a high quality epitaxial film having a reduced influence from the shallow pits, its characteristics and yield can be improved.

DETAILED DESCRIPTION OF THE INVENTION

First, devices that employ a SiC epitaxial film include a device used for power control, such as a Schottky barrier diode, a PIN diode, a MOS diode, a MOS transistor and the like. As the SiC substrate in this case, one having an off angle of 4° or less, which is an angle tilted in the <11-20> direction with respect to the (0001) plane, is generally used. This is because it can preferably increase the yield of the SiC substrate obtained from a SiC ingot and reduces the density of the basal plane dislocation which affects the characteristics and reliability of the device.

Next, epitaxial growth on a SiC substrate will be described. The thermal CVD method used in the present invention is conducted using a simple apparatus configuration and can control the film thickness of epitaxial growth by controlling the flow of a gas, and thus is a growth method excellent in the controllability and reproducibility of the SiC epitaxial film. Among them, a lateral thermal CVD apparatus is suitably used for epitaxial growth.

Figure 1:
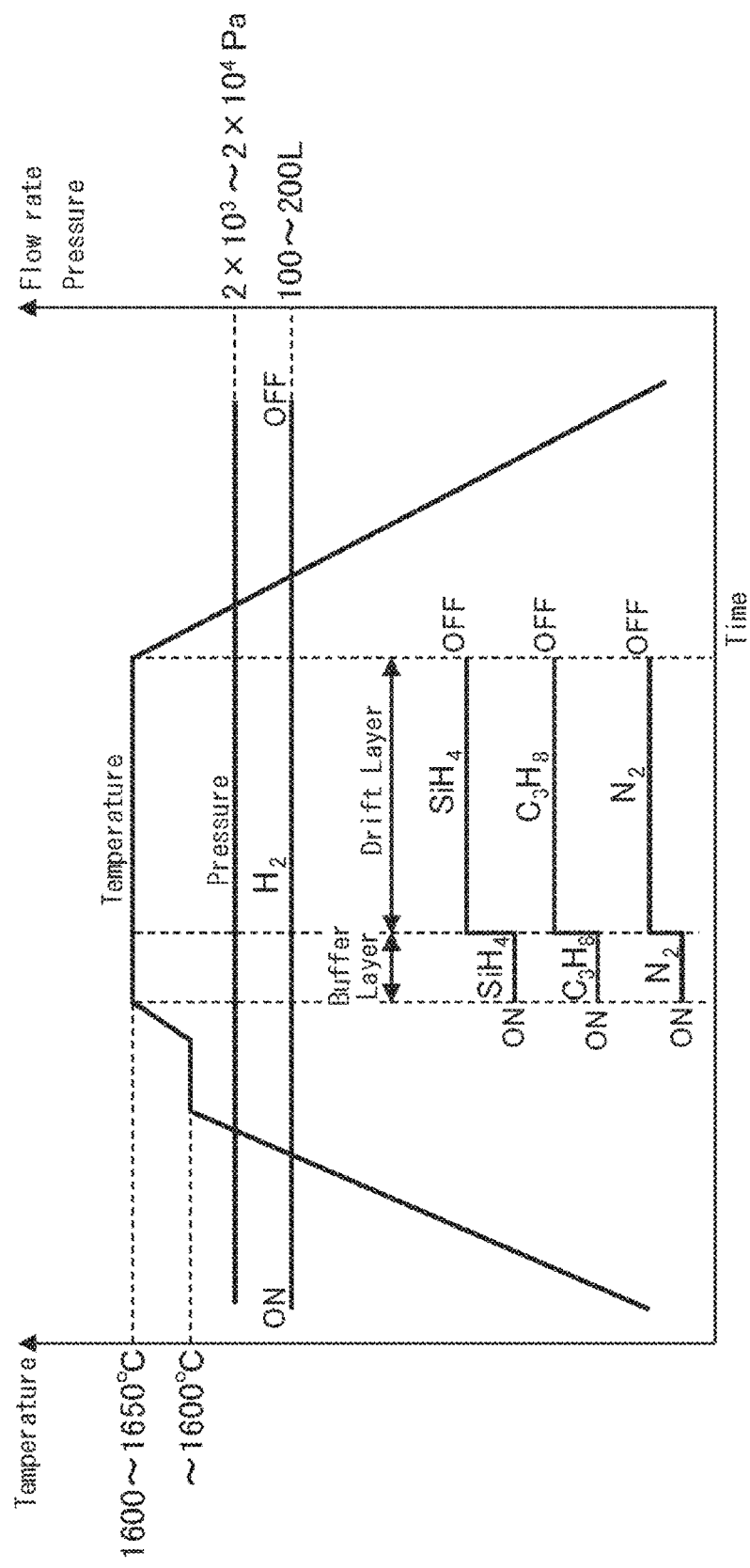
FIG. 1 shows a typical growth sequence for the SiC epitaxial growth on a SiC substrate.

Here, FIG. 1 shows, together with timing for gas introduction, an example of a growth sequence by a conventional thermal CVD method when growing a SiC epitaxial film. First, a SiC substrate is placed in a growth furnace, the interior of the growth furnace is evacuated, and then a carrier gas such as hydrogen is introduced to adjust the pressure in the growth furnace to $2 \times 10^3$ to $2 \times 10^4$ Pa. Thereafter, the temperature of the growth furnace is increased while keeping the pressure constant, and after reaching 1600° C., pretreatment is started in a carrier gas such as hydrogen. At this time, the carrier gas flow rate of hydrogen is 100 to 200 L per minute.

After completion of pretreatment, the temperature is changed to a growth temperature of 1600 to 1650° C. After the temperature is stabilized, $SiH_4$, $C_3H_8$ and $N_2$, the doping gases, is introduced to start the growth of the buffer layer. At this time, the $SiH_4$ flow rate is about 25 to 30 cm³ per minute, the $C_3H_8$ flow rate is about 10 to 15 cm³ per minute (the C/Si ratio is 1.0 to 1.5), and the film thickness is about 1 μm.

After growing the buffer layer, the drift layer is grown and the flow rate of $SiH_4$ at that time is about 130 to 140 cm³ per minute, the flow rate of $C_3H_8$ is about 45 to 70 cm³ per minute (the C/Si ratio is 1.0 to 1.5), and the film thickness is generally about 10 to 30 μm, though it depends on the specifications of the device to be fabricated. The growth rate of the drift layer is 8 to 10 μm per hour. At the time when the desired film thickness has been obtained, the introduction of $SiH_4$, $C_3H_8$ and $N_2$ is stopped, and the temperature is lowered while allowing only hydrogen gas to flow. After the temperature has dropped to room temperature, the introduction of hydrogen gas is stopped, the inside of the growth chamber is evacuated, and an inert gas is introduced into the growth chamber. After the growth chamber has been returned to atmospheric pressure, the SiC substrate is removed. The depth of the shallow pits in the SiC epitaxial film grown in this manner is generally about 50 to 80 nm.

Figure 2A:
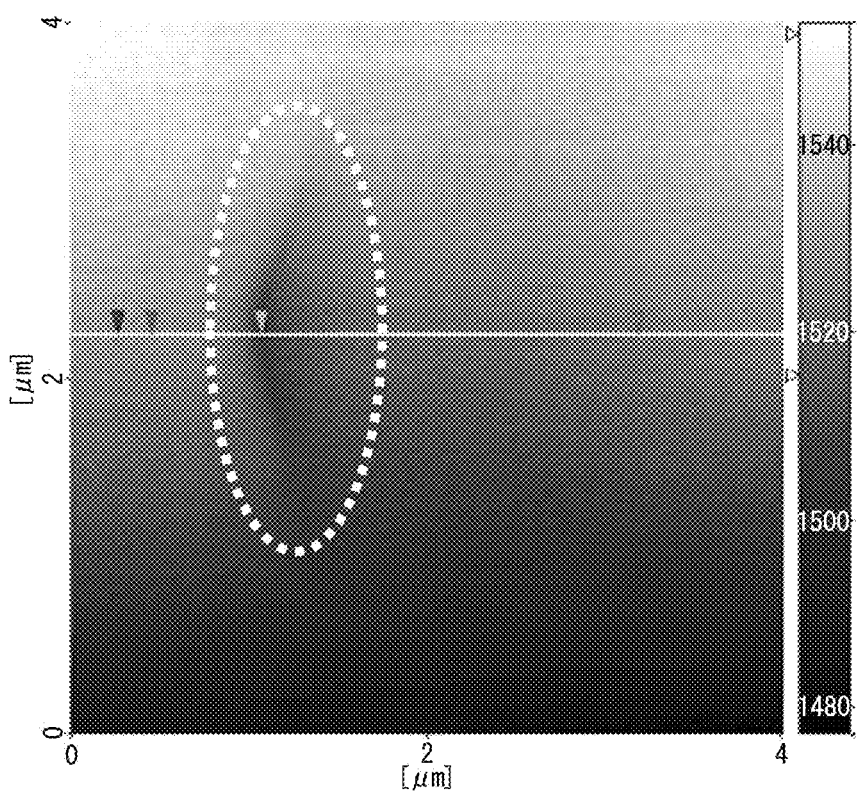
FIG. 2A is an AFM image showing a typical shallow pit in a SiC epitaxial film.
Figure 2B:
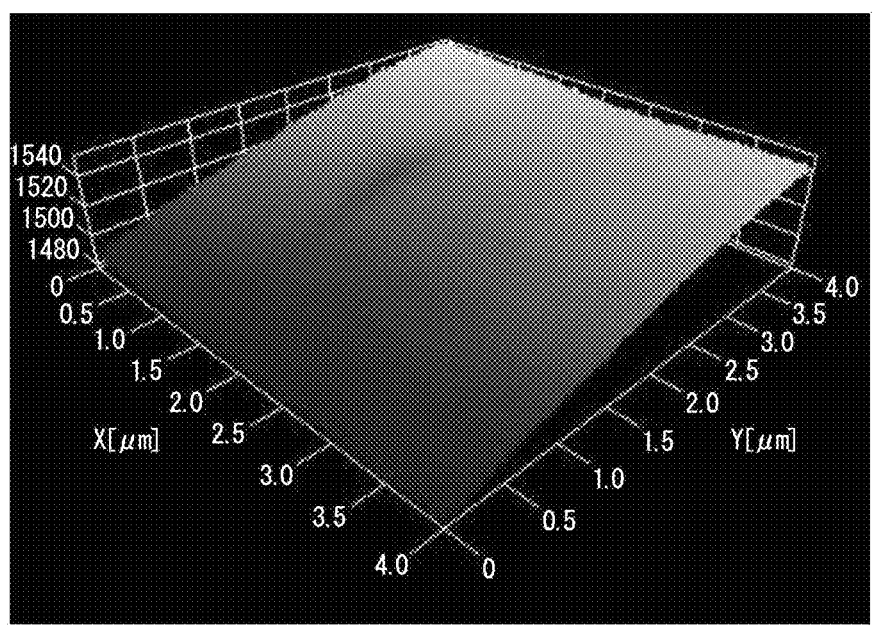
FIG. 2B is a perspective view of a shallow pit obtained by reproducing the AFM image of FIG. 2A by means of computer graphics.
Figure 2C:
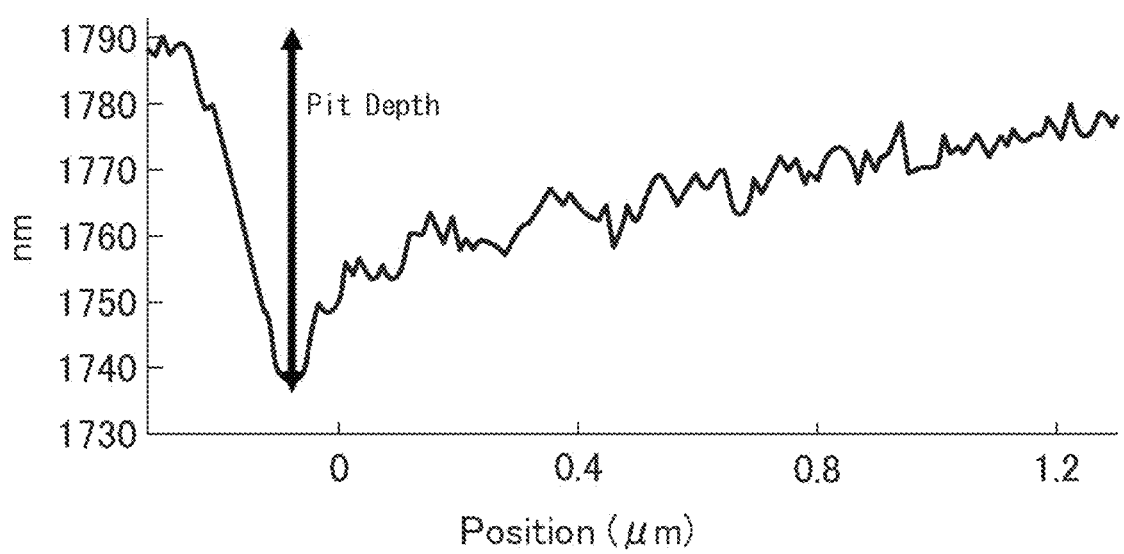
FIG. 2C is an enlarged sectional view of a shallow pit obtained by image analysis of the AFM image of FIG. 2A.

FIG. 2A shows an example of the AFM image of a shallow pit. FIG. 2B and FIG. 2C are the results of image analysis of the AFM image of FIG. 2A, FIG. 2B is a perspective view of the shallow pit of FIG. 2A reproduced using computer graphics, and FIG. 2C is an enlarged sectional view of the shallow pit of FIG. 2A. Such a shallow pit is believed to be generated by virtue of preventing step-flow growth at the screw dislocation portion appearing on the substrate surface when epitaxial growth is started on the SiC substrate.

Therefore, in the present invention, by decreasing the C/Si ratio to 0.5 to 1.0 during the buffer layer growth, step-flow growth can be promoted so that the shallow pits can be made shallow. Here, the generation of Si droplets caused by the excess silicon (si)-based material gas which is produced when the C/Si ratio is less than 0.5 becomes problematic. Conversely, when the C/Si ratio is larger than 1.0, the effect of promoting the step-flow growth becomes reduced. Therefore, the above-mentioned values fall within the preferred range.

Also, the thickness of the buffer layer is important. In the prior art in which the SiC epitaxial film has a two-layer structure comprising a buffer layer and a drift layer, the thickness of the buffer layer used is in most cases about 0.5 to 1.0 μm. However, with such a level of thickness, it is difficult to sufficiently cover the spiral step around the shallow pits with steps in the step-flow direction even if the film is formed with a small C/Si ratio. Therefore, the thickness of the buffer layer is set at 1 μm or more and 10 μm or less. This is because when the thickness is smaller than 1 μm, the surface coating by steps in the step-flow direction is considered insufficient, whereas when it is larger than 10 μm, surface roughness and the like become a problem. The thickness of the buffer layer may preferably be 5 μm or more and 10 μm or less. Within this preferred range, the effect of reducing the depth of the shallow pits is improved, as the thickness of the buffer layer increases.

Also, with respect to the growth rate of the buffer layer, it can be selected as appropriate considering productivity and the like within the range of the C/Si ratio and the thickness described above. However it may preferably be about 1 μm or more and 10 μm or less per hour.

On the other hand, with respect to the drift layer, the film thickness, the doping density, and their in-wafer plane uniformity must satisfy the specifications of a device to be fabricated, and specifically high precision on the doping density and in-plane uniformity are particularly required. To this end, it is essential to reduce the effect of site-competition at a relatively high C/Si ratio (preferably 1.0 to 1.5) during the growth of the drift layer. As a result, even if the shallow pits are made shallow in the buffer layer, there is a possibility that the drift layer may not become shallower any more or conversely may become deep again.

In order to solve this problem, it is considered important to suppress the progress of the spiral step around the shallow pits by increasing the step-flow speed, that is, by increasing the growth rate during the growth of the drift layer. As a result, even in the drift layer, the process of reducing the depth of the shallow pits progresses, and the shallow pits on the epitaxial film whose growth has been completed can become shallower than before. Specifically, the growth rate of the drift layer is 15 μm or more and 100 μm or less per hour. When this is less than 15 μm per hour, the effect of increasing the growth rate, that is, the effect of reducing pit depth by promoting the step-flow, becomes reduced, whereas when it is larger than 100 μm per hour, problems such as surface roughness and increases in step bunching can occur. The preferred growth rate of the drift layer may preferably be 50 μm or more and 100 μm or less per hour.

Within this preferred range, the effect of reducing the depth of the shallow pits may be enhanced, as the thickness of the buffer layer increases.

Based on the discussion on the depth reduction of the shallow pits as described above, the growth sequence of the SiC epitaxial film growth of the present invention will be described as follows.

Pretreatment step: First, the pretreatment up to the start of buffer layer growth is the same as the conventional example explained in FIG. 1.

Buffer layer growth step: The flow rate of $SiH_4$ during the growth of the buffer layer is set at 80 to 100 $cm^3$ per minute and the flow rate of $C_3H_8$ is set at 15 $cm^3$ or more and 30 $cm^3$ or less (the C/Si ratio is 0.5 or more and 1.0 or less), and the film thickness of the buffer layer is set at 1 μm or more and 10 μm or less, for example about 5 μm. Further, the doping density of the buffer layer may preferably be $1\times10^{18}$ atms/$cm^3$ or more and $1\times10^{19}$ atms/$cm^3$ or less.

Drift layer growth step: With regard to the growth of the drift layer, the flow rate of $SiH_4$ is set at 200 to 220 $cm^3$ per minute, the flow rate of $C_3H_8$ is set at 70 to 110 $cm^3$ per minute (the C/Si ratio is 1.0 or more to 1.5 or less), and the growth rate is set at, for example, 20 μm per hour. Here, the film thickness of the drift layer and the flow rate of $N_2$ can be adjusted as appropriate depending on the specifications of the device. In order to obtain a Schottky barrier diode, for example, the thickness of the drift layer is set at about 10 μm or more and to 30 μm or less, and the flow rate of $N_2$ is set at about 40 to 50 $cm^3$ per minute. The process after the drift layer has grown is performed in the same manner as in the conventional method. The doping density of the drift layer may preferably be $1\times10^{15}$ atms/$cm^3$ or more and $1\times10^{17}$ atms/$cm^3$ or less.

Thus, by adjusting the values of the film thickness of at least the buffer layer, the C/Si ratio during the growth of the buffer layer, and the growth rate during the growth of the drift layer to values different from those values which were used in the conventional manner, the depth of the shallow pits on the surface of the epitaxial film whose growth has been completed can be stably reduced to as low as 30 nm or less.

The growth temperature of the buffer layer and the drift layer can be set at 1600 to 1700° C. similarly to the growth of the SiC epitaxial film by the conventional thermal CVD method, and the growth pressure can be also set at 1 kPa to 10 kPa similarly to the conventional thermal CVD method. The material gas used may be the same one used in the conventional method. Specifically, examples of the silicon-based material gas include silane, disilane, trichlorosilane, dichlorosilane, silicon tetrachloride and the like. And examples of the carbon-based material gas include methane, ethane, propane, butane, ethylene, acetylene and the like. These silicon-based or carbon-based material gases may be used alone or in combination of two or more. In addition, these material gases can be supplied to a thermal CVD apparatus together with a carrier gas such as hydrogen.

According to the present invention, a shallow epitaxial film with pits of 30 nm or less can be formed in an epitaxial film on the SiC substrate having an off angle of about 4° or less. But when the C/Si ratio and the total film thickness of the buffer layer during its growth are in the aforementioned ranges, the buffer layer may be formed separately in two or more growth conditions. For the drift layer as well, when the growth rate during its growth is in the aforementioned range, it may be formed separately in two or more growth conditions.

As described above, the present inventors have found that by forming the SiC epitaxial film to be formed on a SiC substrate into a two-layer structure comprising a buffer layer and a drift layer, and by combining the C/Si ratio during the growth of the buffer layer, the thickness of the buffer layer, and the growth rate during the growth of the drift layer, the depth of shallow pits can be reduced to as low as 30 nm or less.

In addition, with regard to an epitaxial SiC single crystal wafer having a SiC epitaxial film that has been grown in this way, when a Schottky barrier diode is formed by providing a Ni-based ohmic electrode on the SiC substrate side and a Ni-based Schottky electrode on the drift layer side, the leakage current at a reverse applied voltage of 400 V becomes $1\times10^{-11}$ $A/cm^2$ or more and $1\times10^{-8}$ $A/cm^2$ or less. This confirmed that in the case of an epitaxial film having such shallow pits, which was realized by the present invention, the electric field concentration at the pit portion can be relieved and the reverse leak current equivalent to that of a pit-free diode can be obtained.

Here, the reason why a Ni-based ohmic electrode is used is that a nickel silicide alloy is formed by heat treatment, and the contact resistance with SiC becomes lowered, and the above electrode is widely used compared with other metals. It is possible to apply a Ni alloy, but from the viewpoint of forming a nickel silicide, Ni alone is considered more advantageous. Although Au and Ti are used in addition to Ni as the Schottky metal, Ni may be most preferred in terms of the characteristics of the Schottky barrier to be formed as well. Ni alloys may also be applicable, but from the viewpoint of reliability, Ni alone may be considered more advantageous.

The method for forming the above ohmic electrode and the above Schottky electrode is not particularly limited. For example, the ohmic electrode may be obtained by depositing Ni on the surface of a SiC substrate, patterning by etching or lifting off the Ni-deposited film formed by vapor deposition, and then performing heat treatment at about 1000° C. In addition, the Schottky electrode may be obtained by depositing Ni on a SiC substrate and patterning by etching or lifting off the Ni-deposited film formed by vapor deposition.

Therefore, the epitaxial SiC single crystal wafer obtained by the present invention is suitable for the fabrication of various electronic devices such as a Schottky barrier diode, a PIN diode, a MOS diode, and a MOS transistor, and may be extremely preferred as a power control device among them.

EXAMPLES

Hereinafter, the present invention will be described based on examples, but the present invention is not limited to their contents in any way.

Example 1

SiC epitaxial growth was performed on the Si surface of a SiC single crystal substrate obtained by slicing a SiC single crystal ingot for a 4 inch (100 mm) wafer at a thickness of about 400 μm, rough grinding, normal polishing with diamond abrasive grains and finish polishing by CMP (chemical mechanical polishing). The polytype of this SiC single crystal substrate is of the 4H type, and the off-angle of the substrate, which is an angle tilted in the <11-20> direction with respect to the (0001) plane, is 4°.

In a procedure for growth, the above SiC single crystal substrate was set in the growth furnace of a lateral thermal CVD apparatus. After the inside of the growth furnace was evacuated, the pressure was adjusted to $7\times10^3$ Pa while introducing 150 L per minute of hydrogen carrier gas. Thereafter, the temperature of the growth furnace was raised to 1630° C. while keeping the pressure constant, and when the temperature stabilized, pretreatment in hydrogen gas was performed for 10 minutes. After pretreatment, without changing the temperature, $SiH_4$ at a flow rate of 110 cm$^3$ per minute, $C_3H_8$ at a flow rate of 18 cm$^3$ per minute (the C/Si ratio is 0.5), and $N_2$ at a flow rate of 5 cm$^3$ per minute were introduced into the growth furnace to start the growth of the buffer layer. The growth rate of the buffer layer at this time was 5 μm per hour, and the doping density of the buffer layer is $1\times10^{18}$ atms/cm$^3$.

After growing the buffer layer by 5 μm, the drift layer was grown by 20 μm with $SiH_4$ at a flow rate of 180 cm$^3$ per minute, $C_3H_8$ at a flow rate of 78 cm$^3$ per minute (the C/Si ratio was 1.3), and $N_2$ at a flow rate of 60 cm$^3$ per minute. The growth rate of the drift layer at this time was 15 μm per hour, and the doping density of the drift layer was $1\times10^{16}$ atms/cm$^3$. After growth was completed, the introduction of $SiH_4$, $C_3H_8$ and $N_2$ was stopped, and the temperature lowered while allowing only hydrogen gas to flow. After the temperature was lowered to room temperature, the introduction of hydrogen gas was stopped, the inside of the growth chamber was evacuated, an inert gas was introduced into the growth chamber, and the growth chamber was returned to the atmospheric pressure prior to removing the substrate.

With respect to the epitaxial SiC single crystal wafer obtained by epitaxial growth conducted in this way, the depth of the shallow pits of the SiC epitaxial film in the drift layer was evaluated. As the evaluation method, AFM was used to calculate the average depth for 10 shallow pits in the wafer surface, and the average value was 21 nm. The results are shown in Table 1.

In addition, a Schottky barrier diode was prototyped on this film. On the back surface (the side of the SiC single crystal substrate), 0.1 μm of Ni was deposited and heat treatment was performed at 1000° C. to form an ohmic contact. On the front surface (on the drift layer side), a Schottky electrode with a diameter of 1 mm was formed by lithography using Ni. In the formation of the Schottky electrode, no heat treatment was performed. The leakage current values for 100 Schottky barrier diodes in the wafer surface at a reverse applied voltage of 400 V were measured and found to be $5\times10^{-9}$ (A/cm$^2$) or less. Since the average value of the leak current of the Schottky barrier diode in the absence of shallow pits is $1\times10^{-8}$ (A/cm$^2$), it was found that when shallow pits have the level of depth as obtained in the present embodiment, excellent device characteristics can be obtained without affecting a leakage current value.

Examples 2 to 81

Epitaxial growth of SiC was performed on the Si surface of a 4-inch (100 mm) SiC single crystal substrate having the 4H-type polytype that had been subjected to slicing, rough grinding, normal polishing and finish polishing in a manner similar to Example 1. Procedures for pretreatment and growth were similar to those in Example 1 except that the off angle of the SiC single crystal substrate (off direction is the same as in Example 1; the same applies to the following Examples and Comparative Examples), the C/Si ratio during the buffer layer growth, the thickness of the buffer layer, and the growth rate of the drift layer were changed as shown in Tables 1 to 3 below in performing growth.

In all cases, the film thickness of the drift layer was 20 μm. The growth rate of the buffer layer was adjusted to be 1 to 10 μm per hour, and the doping density of the buffer layer was adjusted to be $1\times10^{18}$ atms/cm$^3$ to $5\times10^{18}$ atms/cm$^3$. The C/Si ratio of the drift layer was adjusted to be 1.0 to 2.0, and the doping density of the drift layer was adjusted to be $5\times10^{15}$ atms/cm$^3$ to $5\times10^{16}$ atms/cm$^3$. The growth temperature and growth pressure of each of the buffer layer and the drift layer were selected as appropriate in the range of 1630 to 1680° C. and 1.5 kPa to 7.5 kPa.

The growth rate of the drift layer is generally controlled by the $SiH_4$ flow rate, but it can also be controlled by growth temperature, growth pressure, or a combination thereof. The depth of the shallow pits after the growth and the leakage current of the Schottky barrier diode formed on the grown epitaxial film were measured in a manner similar to Example 1. The results are shown in Tables 1 to 3. From the tables below, it was found that for all cases, the depth of shallow pits was 30 nm or less, and the leakage current value was also less than $1\times10^{-8}$ (A/cm$^2$), and thus excellent device characteristics were obtained.

TABLE 1

| Off angle | Buffer layer C/Si ratio | Buffer layer Thickness (μm) | Drift layer Growth rate (μm/hour) | Shallow pit thickness (nm) | Leakage current (A/cm$^2$) at 400 V | Example |
|---|---|---|---|---|---|---|
| 4° | 0.5 | 1 | 15 | 22 | $1\times10^{-9}$~ $5\times10^{-9}$ | 2 |
|  |  |  | 50 | 20 |  | 3 |
|  |  |  | 100 | 20 |  | 4 |
|  |  | 5 | 15 | 21 |  | 1 |
|  |  |  | 50 | 20 |  | 5 |
|  |  |  | 100 | 18 |  | 6 |
|  |  | 10 | 15 | 17 |  | 7 |
|  |  |  | 50 | 15 |  | 8 |
|  |  |  | 100 | 12 |  | 9 |
|  | 0.8 | 1 | 15 | 24 |  | 10 |
|  |  |  | 50 | 24 |  | 11 |
|  |  |  | 100 | 22 |  | 12 |
|  |  | 5 | 15 | 23 |  | 13 |
|  |  |  | 50 | 21 |  | 14 |
|  |  |  | 100 | 19 |  | 15 |
|  |  | 10 | 15 | 19 |  | 16 |
|  |  |  | 50 | 17 |  | 17 |
|  |  |  | 100 | 15 |  | 18 |
|  | 1.0 | 1 | 15 | 27 |  | 19 |
|  |  |  | 50 | 25 |  | 20 |
|  |  |  | 100 | 25 |  | 21 |
|  |  | 5 | 15 | 26 |  | 22 |
|  |  |  | 50 | 23 |  | 23 |
|  |  |  | 100 | 22 |  | 24 |
|  |  | 10 | 15 | 19 |  | 25 |
|  |  |  | 50 | 18 |  | 26 |
|  |  |  | 100 | 17 |  | 27 |

TABLE 2

| Off angle | Buffer layer C/Si ratio | Buffer layer Thickness (μm) | Drift layer Growth rate (μm/hour) | Shallow pit thickness (nm) | Leakage current (A/cm$^2$) at 400 V | Example |
|---|---|---|---|---|---|---|
| 2° | 0.5 | 1 | 15 | 26 | $1\times10^{-9}$~ $7\times10^{-9}$ | 28 |
|  |  |  | 50 | 25 |  | 29 |
|  |  |  | 100 | 25 |  | 30 |
|  |  | 5 | 15 | 24 |  | 31 |

TABLE 2-continued

| Off angle | Buffer layer C/Si ratio | Buffer layer Thickness (μm) | Drift layer Growth rate (μm/hour) | Shallow pit thickness (nm) | Leakage current (A/cm²) at 400 V | Example |
|---|---|---|---|---|---|---|
| | | | 50 | 22 | | 32 |
| | | | 100 | 19 | | 33 |
| | | 10 | 15 | 20 | | 34 |
| | | | 50 | 20 | | 35 |
| | | | 100 | 18 | | 36 |
| | 0.8 | 1 | 15 | 28 | | 37 |
| | | | 50 | 25 | | 38 |
| | | | 100 | 25 | | 39 |
| | | 5 | 15 | 25 | | 40 |
| | | | 50 | 23 | | 41 |
| | | | 100 | 23 | | 42 |
| | | 10 | 15 | 22 | | 43 |
| | | | 50 | 22 | | 44 |
| | | | 100 | 20 | | 45 |
| | 1.0 | 1 | 15 | 29 | | 46 |
| | | | 50 | 27 | | 47 |
| | | | 100 | 25 | | 48 |
| | | 5 | 15 | 27 | | 49 |
| | | | 50 | 25 | | 50 |
| | | | 100 | 24 | | 51 |
| | | 10 | 15 | 25 | | 52 |
| | | | 50 | 25 | | 53 |
| | | | 100 | 22 | | 54 |

TABLE 3

| Off angle | Buffer layer C/Si ratio | Buffer layer Thickness (μm) | Drift layer Growth rate (μm/hour) | Shallow pit thickness (nm) | Leakage current (A/cm²) at 400 V | Example |
|---|---|---|---|---|---|---|
| 0.5° | 0.5 | 1 | 15 | 29 | $1 \times 10^{-9}$~ | 56 |
| | | | 50 | 29 | $9 \times 10^{-9}$ | 56 |
| | | | 100 | 28 | | 57 |
| | | 5 | 15 | 28 | | 58 |
| | | | 50 | 28 | | 59 |
| | | | 100 | 26 | | 60 |
| | | 10 | 15 | 27 | | 61 |
| | | | 50 | 25 | | 62 |
| | | | 100 | 24 | | 63 |
| | 0.8 | 1 | 15 | 30 | | 64 |
| | | | 50 | 28 | | 65 |
| | | | 100 | 27 | | 66 |
| | | 5 | 15 | 28 | | 67 |
| | | | 50 | 27 | | 68 |
| | | | 100 | 25 | | 69 |
| | | 10 | 15 | 26 | | 70 |
| | | | 50 | 25 | | 71 |
| | | | 100 | 25 | | 72 |
| | 1.0 | 1 | 15 | 30 | | 73 |
| | | | 50 | 30 | | 74 |
| | | | 100 | 29 | | 75 |
| | | 5 | 15 | 29 | | 76 |
| | | | 50 | 29 | | 77 |
| | | | 100 | 27 | | 78 |
| | | 10 | 15 | 28 | | 79 |
| | | | 50 | 26 | | 80 |
| | | | 100 | 26 | | 81 |

Example 82

Epitaxial growth of SiC was performed on the Si surface of a 4-inch (100 mm) SiC single crystal substrate having the 4H-type polytype that had been subjected to slicing, rough grinding, normal polishing and finish polishing in a manner similar to Example 1. The off angle of the SiC single crystal substrate was 4°. Procedures for pretreatment and growth were similar to those in Example 1. SiH$_4$ at a flow rate of 110 cm$^3$ per minute, C$_3$H$_8$ at a flow rate of 18 cm$^3$ per minute (the C/Si ratio was 0.5), and N$_2$ at a flow rate of 5 cm$^3$ per minute were introduced into the growth furnace to start the growth of the buffer layer. After growing the buffer layer by 5 μm, the flow rate of SiH$_4$ was set at 110 cm$^3$ per minute, the flow rate of C$_3$H$_8$ at 30 cm$^3$ per minute (the C/Si ratio was 0.8), and the flow rate of N$_2$ at 5 cm$^3$ per minute so as to grow the buffer layer of the second layer by 5 μm. The growth rate of each buffer layer was 4 to 8 μm per hour and the doping density was $1 \times 10^{18}$ atms/cm$^3$ to $5 \times 10^{18}$ atms/cm$^3$.

After growing the buffer layer by 5 μm, the drift layer was grown by 20 μm with SiH$_4$ set at a flow rate of 180 cm$^3$ per minute, C$_3$H$_8$ at a flow rate of 78 cm$^3$ per minute (the C/Si ratio was 1.3), and N$_2$ at a flow rate of 60 cm$^3$ per minute. The growth rate of the drift layer at this time was 15 μm per hour, and the doping density of the drift layer was $1 \times 10^{16}$ atms/cm$^3$. After growth was completed, the introduction of SiH$_4$, C$_3$H$_8$ and N$_2$ was stopped, and the temperature was lowered while allowing only hydrogen gas to flow. After the temperature was lowered to room temperature, the introduction of hydrogen gas was stopped, the inside of the growth chamber was evacuated, an inert gas was introduced into the growth chamber, and the growth chamber was returned to atmospheric pressure prior to removing the substrate.

With respect to the epitaxial SiC single crystal wafer obtained by epitaxial growth conducted in this way, the average depth of the shallow pits of the SiC epitaxial film in the drift layer was confirmed to be 25 nm in a manner similar to Example 1. In addition, in a manner similar to Example 1 the leakage current of 100 in-plane Schottky barrier diodes was investigated. As a result, the leakage current at a reverse applied voltage of 400V was $5 \times 10^{-9}$ to $8 \times 10^{-9}$ (A/cm²), indicating that excellent device characteristics had been obtained.

Example 83

Epitaxial growth of SiC was performed on the Si surface of a 4-inch (100 mm) SiC single crystal substrate having the 4H-type polytype that had been subjected to slicing, rough grinding, normal polishing and finish polishing in a manner similar to Example 1. The off angle of the SiC single crystal substrate was 4°. Procedures for pretreatment and growth were similar to those in Example 1. SiH$_4$ at a flow rate of 110 cm$^3$ per minute, C$_3$H$_8$ at a flow rate of 18 cm$^3$ per minute (the C/Si ratio was 0.5), and N$_2$ at a flow rate of 5 cm$^3$ per minute were introduced into the growth furnace to start the growth of the buffer layer. After growing the buffer layer by 5 μm, the flow rate of SiH$_4$ was set at 180 cm$^3$ per minute, the flow rate of C$_3$H$_8$ at 78 cm$^3$ per minute (the C/Si ratio was 1.3), and the flow rate of N$_2$ at 60 cm$^3$ per minute so as to grow the drift layer of the first layer by 5 μm. Then the flow rate of SiH$_4$ was set at 200 cm$^3$ per minute, the flow rate of C$_3$H$_8$ at 100 cm$^3$ per minute (the C/Si ratio was 1.5), and the flow rate of N$_2$ at 60 cm$^3$ per minute so as to grow the drift layer of the second layer by 15 μm. With the growth rate of each drift layer, the growth rate of the first layer was 15 μm per hour and the growth rate of the second layer was 20 μm per hour. The doping density of the buffer layer was $1 \times 10^{18}$ atms/cm$^3$, and the doping density of the drift layer was $5 \times 10^{15}$ atms/cm$^3$ to $1 \times 10^{16}$ atms/cm$^3$.

After growth was completed, the introduction of SiH$_4$, C$_3$H$_8$ and N$_2$ was stopped, and the temperature was lowered while allowing only hydrogen gas to flow. After the temperature was lowered to room temperature, the introduction of hydrogen gas was stopped, and the inside of the growth chamber was evacuated, an inert gas was introduced into the growth chamber, and the growth chamber was returned to atmospheric pressure prior to removing the substrate.

With respect to the epitaxial SiC single crystal wafer obtained by epitaxial growth conducted in this way, the average depth of the shallow pits of the SiC epitaxial film in the drift layer was confirmed to be 28 nm in a manner similar to Example 1. In addition, the leakage current of 100 in-plane Schottky barrier diodes at a reverse applied voltage of 400V was $4 \times 10^{-9}$ to $9 \times 10^{-9}$ (A/cm$^2$), indicating that excellent device characteristics had been obtained.

Comparative Example 1

Epitaxial growth of SiC was performed on the Si surface of a 4-inch (100 mm) SiC single crystal substrate having the 4H-type polytype that had been subjected to slicing, rough grinding, normal polishing and finish polishing in a manner similar to Example 1. The off angle of the SiC single crystal substrate was 4°. Procedures for pretreatment and growth were similar to those in Example 1 except that SiH$_4$ at a flow rate of 50 cm$^3$ per minute, C$_3$H$_8$ at a flow rate of 20 cm$^3$ per minute (the C/Si ratio was 1.2), and N$_2$ at a flow rate of 5 cm$^3$ per minute were introduced into the growth furnace to grow the buffer layer by 5 μm. Thereafter, the flow rate of SiH$_4$ was set at 210 cm$^3$ per minute, the flow rate of C$_3$H$_8$ at 91 cm$^3$ per minute (the C/Si ratio was 1.3), and the flow rate of N$_2$ at 60 cm$^3$ per minute so as to grow the drift layer by 20 μm, and the growth rate of the drift layer at this time was 20 μm per hour.

The epitaxial SiC single crystal wafer grown and obtained in this manner was observed in a manner similar to Example 1. The average depth of the shallow pits of the SiC epitaxial film in the drift layer was confirmed to be 70 nm, and the leakage current of 100 in-plane Schottky barrier diodes at a reverse applied voltage of 400V was $5 \times 10^{-5}$ to $8 \times 10^{-5}$ (A/cm$^2$). Probably by virtue of the deep shallow pits caused by the high C/Si ratio during growth of the buffer layer, the device characteristics were deteriorated.

Comparative Example 2

Epitaxial growth of SiC was performed on the Si surface of a 4-inch (100 mm) SiC single crystal substrate having the 4H-type polytype that had been subjected to slicing, rough grinding, normal polishing and finish polishing in a manner similar to Example 1. The off angle of the SiC single crystal substrate was 4°. Procedures for pretreatment and growth were similar to those in Example 1 except that SiH$_4$ at a flow rate of 50 cm$^3$ per minute, C$_3$H$_8$ at a flow rate of 7 cm$^3$ per minute (the C/Si ratio was 0.4), and N$_2$ at a flow rate of 5 cm$^3$ per minute were introduced into the growth furnace to grow the buffer layer by 5 μm. Then, the flow rate of SiH$_4$ was set at 210 cm$^3$ per minute, the flow rate of C$_3$H$_8$ at 91 cm$^3$ per minute (the C/Si ratio was 1.3), and the flow rate of N$_2$ at 60 cm$^3$ per minute to grow the drift layer by 20 μm. The growth rate of the drift layer at this time was 20 μm per hour.

The epitaxial SiC single crystal wafer grown and obtained in this manner was observed in a manner similar to Example 1. The average depth of the shallow pits of the SiC epitaxial film in the drift layer was 45 nm, and the leakage current of 100 in-plane Schottky barrier diodes at a reverse applied voltage of 400V was $1 \times 10^{-5}$ to $8 \times 10^{-5}$ (A/cm$^2$). As a probable reason for this, the low C/Si ratio during the growth of the buffer layer had some effect in reducing the depth of the shallow pits, but Si droplets were generated in the buffer layer, and irregularities resulting therefrom were carried on to the drift layer, deteriorating the device characteristics.

Comparative Example 3

Epitaxial growth of SiC was performed on the Si surface of a 4-inch (100 mm) SiC single crystal substrate having the 4H-type polytype that had been subjected to slicing, rough grinding, normal polishing and finish polishing in a manner similar to Example 1. The off angle of the SiC single crystal substrate was 4°. Procedures for pretreatment and growth were similar to those in Example 1 except that SiH$_4$ at a flow rate of 50 cm$^3$ per minute, C$_3$H$_8$ at a flow rate of 13 cm$^3$ per minute (the C/Si ratio was 0.8), and N$_2$ at a flow rate of 5 cm$^3$ per minute were introduced into the growth furnace to grow the buffer layer by 5 μm. Then, the flow rate of SiH$_4$ was set at 100 cm$^3$ per minute, the flow rate of C$_3$H$_8$ at 43 cm$^3$ per minute (the C/Si ratio was 1.3), and the flow rate of N$_2$ at 60 cm$^3$ per minute to grow the drift layer by 20 μm. The growth rate of the drift layer at this time was 10 μm per hour.

The epitaxial SiC single crystal wafer grown and obtained in this manner was observed in a manner similar to Example 1. The average depth of the shallow pits of the SiC epitaxial film in the drift layer was 60 nm, and the leakage current of 100 in-plane Schottky barrier diodes at a reverse applied voltage of 400V was $5 \times 10^{-7}$ to $5 \times 10^{-6}$ (A/cm$^2$). This is probably because the low growth rate of the drift layer had no effect of reducing the depth of the shallow pits and this deteriorated the device characteristics.

Comparative Example 4

Epitaxial growth of SiC was performed on the Si surface of a 4-inch (100 mm) SiC single crystal substrate having the 4H-type polytype that had been subjected to slicing, rough grinding, normal polishing and finish polishing in a manner similar to Example 1. The off angle of the SiC single crystal substrate was 4°. Procedures for pretreatment and growth were similar to those in Example 1 except that SiH$_4$ at a flow rate of 50 cm$^3$ per minute, C$_3$H$_8$ at a flow rate of 13 cm$^3$ per minute (the C/Si ratio was 0.8), and N$_2$ at a flow rate of 5 cm$^3$ per minute were introduced into the growth furnace to grow the buffer layer by 5 μm. Then, the flow rate of SiH$_4$ was set at 1500 cm$^3$ per minute, the flow rate of C$_3$H$_8$ at 650 cm$^3$ per minute (the C/Si ratio was 1.3), and the flow rate of N$_2$ at 600 cm$^3$ per minute to grow the drift layer by 20 μm. The growth rate of the drift layer at this time was 150 μm per hour.

The epitaxial SiC single crystal wafer grown and obtained in this manner was confirmed in a manner similar to Example 1. The average depth of the shallow pits of the SiC epitaxial film in the drift layer was 48 nm, and the leakage current of 100 in-plane Schottky barrier diodes at a reverse applied voltage of 400V was $1 \times 10^{-5}$ to $5 \times 10^{-5}$ (A/cm$^2$). This is probably due to the fact that the exceedingly high growth rate of the drift layer generated step bunching and therefore deteriorated the device characteristics, though it had some effect of reducing the depth of the shallow pits.

Comparative Example 5

Epitaxial growth of SiC was performed on the Si surface of a 4-inch (100 mm) SiC single crystal substrate having the 4H-type polytype that had been subjected to slicing, rough grinding, normal polishing and finish polishing in a manner similar to Example 1. The off angle of the SiC single crystal substrate was 4°. Procedures for pretreatment and growth were similar to those in Example 1 except that $SiH_4$ at a flow rate of 50 cm³ per minute, $C_3H_8$ at a flow rate of 13 cm³ per minute (the C/Si ratio was 0.8), and $N_2$ at a flow rate of 5 cm³ per minute were introduced into the growth furnace to grow the buffer layer by 0.5 μm. Then, the flow rate of $SiH_4$ was set at 210 cm³ per minute, the flow rate of $C_3H_8$ at 91 cm³ per minute (the C/Si ratio was 1.3), and the flow rate of $N_2$ at 60 cm³ per minute to grow the drift layer by 20 μm. The growth rate of the drift layer at this time was 20 μm per hour.

The epitaxial SiC single crystal wafer grown and obtained in this manner was observed in a manner similar to Example 1. The average depth of the shallow pits of the SiC epitaxial film in the drift layer was 55 nm, and the leakage current of 100 in-plane Schottky barrier diodes at a reverse applied voltage of 400V was $5×10^{-6}$ to $8×10^{-6}$ (A/cm²). This is probably due to the fact that the small thickness of the buffer layer had no effect of reducing the depth of the shallow pits and this deteriorated the device characteristics.

Comparative Example 6

Epitaxial growth of SiC was performed on the Si surface of a 4-inch (100 mm) SiC single crystal substrate having the 4H-type polytype that had been subjected to slicing, rough grinding, normal polishing and finish polishing in a manner similar to Example 1. The off angle of the SiC single crystal substrate was 4°. Procedures for pretreatment and growth were similar to those in Example 1 except that $SiH_4$ at a flow rate of 50 cm³ per minute, $C_3H_8$ at a flow rate of 13 cm³ per minute (the C/Si ratio was 0.8), and $N_2$ at a flow rate of 5 cm³ per minute were introduced into the growth furnace to grow the buffer layer by 15 μm. Then, the flow rate of $SiH_4$ was set at 210 cm³ per minute, the flow rate of $C_3H_8$ at 91 cm³ per minute (the C/Si ratio was 1.3), and the flow rate of $N_2$ at 60 cm³ per minute to grow the drift layer by 20 μm. The growth rate of the drift layer at this time was 20 μm per hour.

The epitaxial SiC single crystal wafer grown and obtained in this manner was observed in a manner similar to Example 1. The average depth of the shallow pits of the SiC epitaxial film in the drift layer was 50 nm, and the leakage current of 100 in-plane Schottky barrier diodes at a reverse applied voltage of 400V was $1×10^{-5}$ to $3×10^{-5}$ (A/cm²). This is probably due to the fact that the large thickness of the buffer layer generated a surface roughness of the buffer layer and it deteriorated the device characteristics, though it had some effect of reducing the depth of the shallow pits.

INDUSTRIAL APPLICABILITY

According to the present invention, it becomes possible to stably fabricate an epitaxial SiC single crystal wafer having a high quality epitaxial film in which the depth of the shallow pits is reduced particularly in the epitaxial growth of SiC on the SiC single crystal substrate. Therefore, according to an electronic device which is formed on the wafer produced by the method according to the present invention, the improvement of characteristics and yield of the device can be expected.

The invention claimed is:

1. An epitaxial silicon carbide single crystal wafer comprising:
   a silicon carbide single crystal substrate having an off angle of 4° or less, which is an angle tilted in the <11-20> direction with respect to a (0001) plane;
   a buffer layer, formed on the silicon carbide single crystal substrate, having a doping density of $1×10^{18}$ atms/cm³ or more and $1×10^{19}$ atms/cm³ or less and consisting of a silicon carbide epitaxial film having a thickness of 5 μm or more and 10 μm or less; and
   a drift layer, formed on the buffer layer, having a doping density of $1×10^{15}$ atms/cm³ or more and $1×10^{17}$ atms/cm³ or less and consisting of a silicon carbide epitaxial film having a thickness of 10 μm or more and 30 μm or less,
   wherein a depth of shallow pits on the surface of the drift layer is 19 nm or less, and
   wherein the shallow pits are formed by a screw dislocation of the silicon carbide single crystal wafer.

2. The epitaxial silicon carbide single crystal wafer according to claim 1,
   wherein when a Schottky barrier diode is formed by providing a Ni-based ohmic electrode on a side of the silicon carbide single crystal substrate and a Ni-based Schottky electrode on a side of the drift layer, a leakage current at a reverse applied voltage of 400 V becomes $1×10^{-11}$ A/cm² or more and $1×10^{-8}$ A/cm² or less.

* * * * *